United States Patent [19]

Takemura et al.

[11] Patent Number: 5,132,864

[45] Date of Patent: Jul. 21, 1992

[54] PRINTED CIRCUIT BOARD

[75] Inventors: Shinji Takemura; Yoshitami Saitou, both of Aichi, Japan

[73] Assignee: Aisin Seiki K.K., Aichi, Japan

[21] Appl. No.: 675,000

[22] Filed: Mar. 26, 1991

[30] Foreign Application Priority Data

Mar. 26, 1990 [JP] Japan .................... 2-030864[U]

[51] Int. Cl.$^5$ ............................................ H05K 7/06
[52] U.S. Cl. .................................. 361/409; 361/400; 174/260
[58] Field of Search ............... 361/400, 403, 409, 417, 361/418, 420, 255; 174/260

[56] References Cited

U.S. PATENT DOCUMENTS

| | | | |
|---|---|---|---|
| 3,562,592 | 2/1971 | Cooke | 361/403 X |
| 4,339,785 | 7/1982 | Ohsawa | 361/400 X |
| 4,413,309 | 11/1983 | Takahashi et al. | 361/400 X |
| 4,774,634 | 9/1988 | Tate et al. | 361/400 |
| 4,883,920 | 11/1989 | Tanabe et al. | 361/409 X |

Primary Examiner—Gerald P. Tolin
Assistant Examiner—Paramita Ghosh
Attorney, Agent, or Firm—Sughrue, Mion, Zinn, Macpeak & Seas

[57] ABSTRACT

A printed circuit board includes a substrate, a printed electric circuit pattern formed on the surface of the substrate, a plurality of land patterns formed on end portions of the printed electric circuit pattern, an isolation layer formed on the surface of the substrate and printed electric circuit pattern, an opening formed in the isolation layer about each land pattern, a plurality of electrical devices arranged on the land patterns and a plurality of markers printed on the surface of the isolation layer enclosing corresponding electrical devices.

5 Claims, 1 Drawing Sheet

PRINTED CIRCUIT BOARD

BACKGROUND OF THE INVENTION

The present invention relates to a printed circuit board which has been extensively used to provide an electric circuit and in particular, to a printed circuit board for preventing misalignment of electrical devices on the printed circuit board.

Under ordinary circumstances, many electrical devices are arranged on the surface of a printed circuit board. A marker line is printed on the surface of the printed circuit board for assuring the accurate positioning of each device at a desired place on the printed circuit board. When electrical devices are arranged on the printed circuit board, the electrical devices are arranged along the marker line.

However, the conventional printed circuit board has drawbacks as detailed hereinbelow. That is to say, when an electrical devices is arranged on the printed circuit board, each electrical device might be arranged in an inclined condition relative to the marker line. As a result, electrical conduction might not be established between the printed electric circuit pattern and each electrical device.

SUMMARY OF THE INVENTION

It is, therefore, a principal object of the present invention to provide a printed circuit board without the foregoing drawbacks.

Another object of the present invention is to insure current flow between the printed electric circuit pattern and each electrical device.

It is a further object of the present invention to produce a printed circuit board which can prevent the misalignment of the electrical devices thereon.

In order to attain the foregoing objects, a printed circuit board comprises a substrate, a printed electric circuit pattern formed on the surface of the substrate, a plurality of land patterns formed on end portions of the printed electric circuit pattern, an isolation layer which is formed on the surface of the substrate and the printed electric circuit pattern, an opening formed in the isolation layer around the land patterns, a plurality of electrical devices arranged on the surface of the land patterns and markers printed on the surface of the isolation layer and enclosing corresponding electrical devices.

The foregoing and other objects, features and advantages of the invention will be apparent from the following more particular description of a preferred embodiment of the invention as illustrated in the accompanying drawings.

DETAILED DESCRIPTION OF A PREFERRED EMBODIMENT

Figure 1:
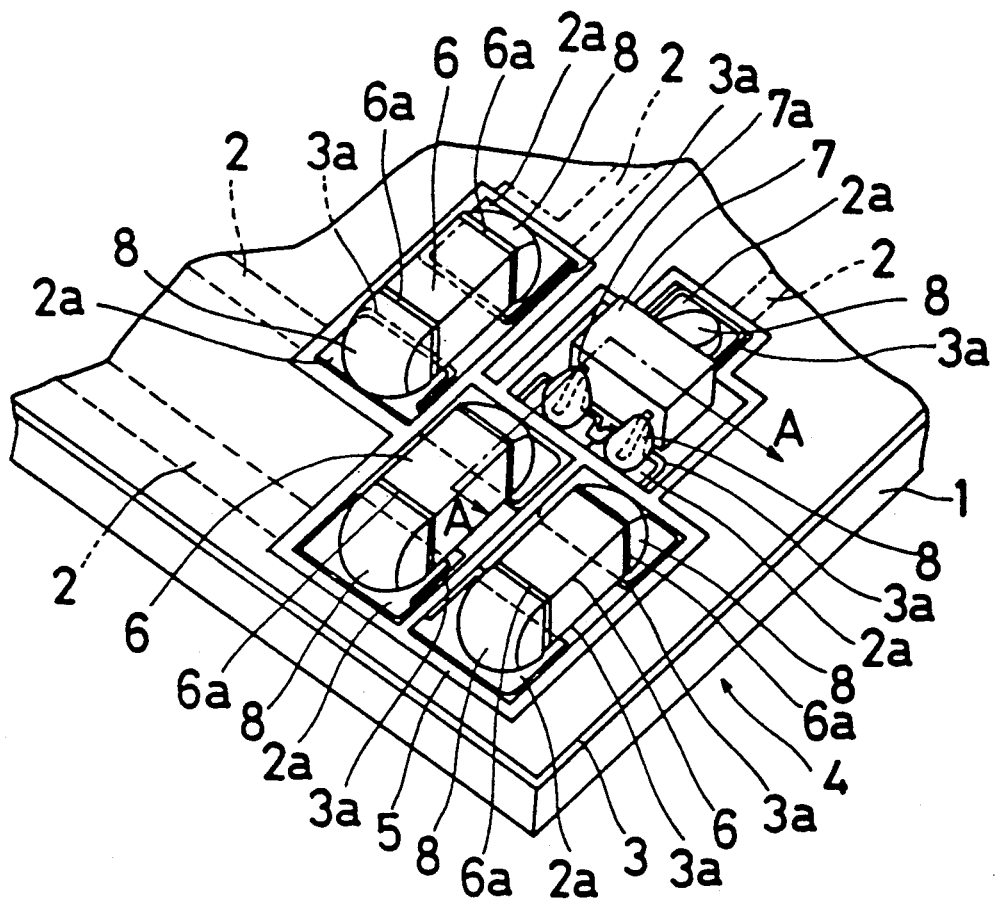
FIG. 1 shows a perspective view of a printed board device according to the present invention.

FIG. 1 represents a perspective view of a printed circuit board 4 of the present invention. Referring first to FIG. 1, the printed circuit board 4 has a substrate 1, printed electrical patterns 2, an isolation layer 3 and electrical devices 6 and 7. The printed electric circuit pattern 2 is comprised of copper foil to permit current flow. The copper foil of the printed electric circuit pattern 2 is produced by an etching process which is well known, and is formed into a predetermined shape. Each end portion of the printed electric circuit pattern 2 has a land pattern 2a. So as to establish current flow, the electrical devices 6 and 7 are arranged on the surfaces of the land patterns 2a. As a result, a predetermined electrical conducting relationship therebetween is established. The isolation layer 3 is formed on the surface of the substrate 1 by a well known process. The isolation layer 3 and the printed land patterns 2a have the same thickness.

An opening 3a is formed in the surface of the isolation layer 3 to connect the electrical devices 6 and 7. The electrical devices 6 and 7 have electrical terminals 6a and 7a, respectively. The electrical terminals are directly formed on the side surfaces of the electrical devices 6 and 7. The electrical terminals 6a and 7a are located on the surfaces of the land patterns 2a, which are formed on the substrate 1 and electrically connect with each other. The electrical terminals are soldered at connections 8 on the surfaces of the land patterns 2a.

Figure 2:
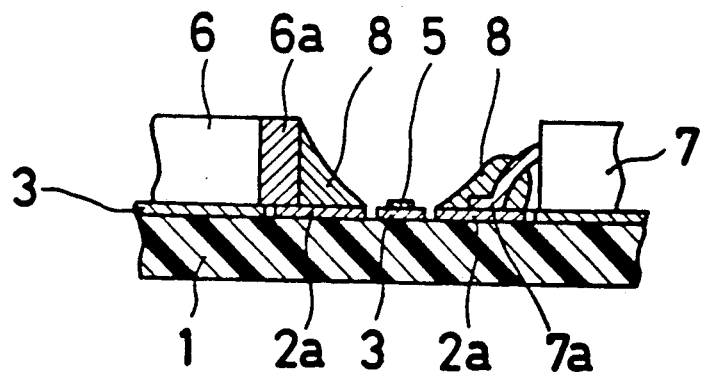
FIG. 2 shows a cross-sectional view taken along the line A—A of FIG. 1.

FIG. 2 represents a cross-sectional view taken along the line A—A of FIG. 1. The electrical terminals 6a and 7a are arranged on the surfaces of the land patterns 2a. A solder joint 8 is applied between the land pattern 2a and the electrical terminal 6a. Similarly, a solder joint 8 is applied between the land pattern 2a and the electrical terminal 7a. Each land pattern 2a is not connected to the isolation layer 3. In other words, the land patterns 2a are independently formed on the substrate 1 for establishing electrical connections between each electrical device and the printed circuit 2.

Referring back to FIG. 1, a quadrilateral shaped marker 5, which is made of an isolation material, is printed on the surface of the isolation layer 3. The marker 5 is printed by a well known screen printing process. So as to prevent improper electrical connections, the marker 5 is not formed in the opening 3a. The quadrilateral shaped marker 5 has, for example, a square shape or a rectangular shape. The markers 5 enclose each of the electrical devices 6 and 7. In this embodiment, the electrical device 6 has two electrical terminals 6a as shown in FIG. 1. On the other hand, the electrical device 7 has three electrical terminals 7a as shown in FIG. 1. The shape of the marker which is printed on the substrate 1 is dependent on the shape of the electrical device 6 or 7 to be enclosed by the marker 5.

Again, as shown in FIG. 2, the marker 5 is printed on the surface of the isolation layer 3. Each of the electrical terminals contact the land patterns 2a. The electrical devices are fixed to the land patterns 2a by a soldered connection 8.

Under the above circumstances, the present invention provides the following advantages.

(a) The arrangement of each device on the land patterns can be confirmed by the marker 5.

(b) The relationship between the electrical devices and the substrate can be easily confirmed by the markers 5.

While the invention has been particularly shown and described with reference to preferred embodiments thereof, it will be understood by those in the art that the foregoing and other changes in form and details may be made therein without departing from the spirit and scope of the invention.

What is claimed is:

1. A printed circuit board comprising: a substrate;

a printed electric circuit pattern formed on the surface of the substrate;

a plurality of land patterns formed on end portions of the printed electric circuit pattern;

an isolation layer formed on the surface of the substrate and the printed electric circuit pattern;

an opening formed in said isolation layer around each of said land patterns;

a plurality of electrical devices each connected between at least two land patterns; and a plurality of markers of non-conductive material each having a configuration corresponding to the configuration of each electrical device printed on the isolation layer and surrounding each of said electrical devices and the land patterns to which each electrical device is connected.

2. A printed circuit board according to claim 1, wherein one of the markers has a square configuration.

3. A printed circuit board according to claim 1, wherein one of the markers has a rectangular configuration.

4. A printed circuit board according to claim 1, wherein each electrical device is fixed to a land pattern by a soldered connection.

5. A printed circuit board according to claim 1, wherein at least one electrical device has three electric terminals for being connected to three corresponding land patterns.

* * * * *